United States Patent
Bjorgaard et al.

(10) Patent No.: US 11,171,103 B2
(45) Date of Patent: Nov. 9, 2021

(54) SOLDER BALL DIMENSION MANAGEMENT

(71) Applicant: International Business Machines Corporation, Armonk, NY (US)

(72) Inventors: Jason J. Bjorgaard, Rochester, MN (US); Layne A. Berge, Rochester, MN (US); John R. Dangler, Rochester, MN (US); Matthew Doyle, Chatfield, MN (US); Thomas W. Liang, Rochester, MN (US); Kyle Schoneck, Rochester, MN (US); Matthew A. Walther, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 24 days.

(21) Appl. No.: 16/734,583

(22) Filed: Jan. 6, 2020

(65) Prior Publication Data
US 2021/0210448 A1 Jul. 8, 2021

(51) Int. Cl.
*H01L 23/00* (2006.01)

(52) U.S. Cl.
CPC ............ *H01L 24/13* (2013.01); *H01L 24/16* (2013.01); *H01L 24/81* (2013.01); *H01L 2224/1316* (2013.01); *H01L 2224/13076* (2013.01); *H01L 2224/13149* (2013.01); *H01L 2224/16227* (2013.01); *H01L 2224/81815* (2013.01); *H01L 2924/014* (2013.01); *H01L 2924/01006* (2013.01); *H01L 2924/0133* (2013.01)

(58) Field of Classification Search
CPC ....................................................... H01L 24/13
See application file for complete search history.

(56) References Cited

U.S. PATENT DOCUMENTS

| | | |
|---|---|---|
| 5,476,211 A | 12/1995 | Khandros |
| 5,887,345 A | 3/1999 | Kulesza et al. |
| 5,968,670 A * | 10/1999 | Brofman ............... H01L 24/16 428/576 |
| 6,314,201 B1 | 11/2001 | Roder |
| 6,399,896 B1 | 6/2002 | Downes, Jr. et al. |
| 6,461,136 B1 | 10/2002 | Gruber et al. |
| 8,441,808 B2 | 5/2013 | Chow |
| 2005/0164527 A1 | 7/2005 | Radza et al. |
| 2010/0302749 A1 | 12/2010 | Kao et al. |
| 2014/0268603 A1 | 9/2014 | Hoffmeyer et al. |

(Continued)

OTHER PUBLICATIONS

Anonymous, "A New Method of Compensating for BGA Package Warpage," An IP.com Prior Art Database Technical Disclosure, IP.com No. IPCOM000209379D, Aug. 2, 2011, 4 pages. https://ip.com/IPCOM/000209379.

(Continued)

*Primary Examiner* — William A Harriston
(74) *Attorney, Agent, or Firm* — Scott S. Dobson

(57) ABSTRACT

A solder ball assembly can include a first spring element having a first shape and formed from a first elastic electrically conductive material. The solder ball assembly can also include a second spring element having a second shape and formed from a second elastic electrically conductive material. The second spring element is mechanically attached to the first spring element to form a spring assembly. The solder ball can be configured to enclose the spring assembly.

20 Claims, 4 Drawing Sheets

(56) References Cited

U.S. PATENT DOCUMENTS

2015/0076714 A1     3/2015   Haba et al.
2017/0181271 A1     6/2017   Yee et al.

OTHER PUBLICATIONS

Gao et al., "Compliant Wafer Level Package for Enhanced Reliability," Proceedings of HDP ' 07, 2007 International Symposium on High Density Packaging and Microsystem Integration, 2007, 5 pages, IEEE.

Lee, D., "Root Cause Failure Analysis of Printed Circuit Board Assemblies," SMTA: Surface Mount Technology Association, Wisconsin Chapter, Mar. 8, 2011, 62 pages. https://www.smta.org/chapters/files/wisconsin_dfx-root_cause_failure_analysis_final.pdf.

Creative Electron—The X-Ray People, https://creativeelectron.com/, Printed Aug. 27, 2019, 5 pages.

Mass, "Vertical vacuum plugging machine," https://www.mass-pcb.de/viaholefilling.html, Printed Aug. 27, 2019, 2 pgs.

Adeon, "Horizontal Vacuum Filling," https://www.adeon.nl/products/hole-filling-systems/horizontal-vacuum-filling, Printed Aug. 27, 2019, 6 pages.

Yeary et al., Variables Affecting Bare PCB Warpage During Reflow; A Study on Support Methods and Temperature Uniformity, PCB West 2017, 46 pages. akrometrix.com/wp-content/uploads/2016/02/Variables-Affecting-Bare-PCB-Warpage-During-Reflow.pdf.

\* cited by examiner

200 Solder Ball Assembly (Cross-Section View)

225 Solder Ball Assembly (Top View)

250 Broad Solder Ball Assembly (Cross-Section View)

275 Columnar Solder Ball Assembly (Cross-Section View)

SOLDER BALL DIMENSION MANAGEMENT

BACKGROUND

The present disclosure generally relates to attachment of integrated circuit (IC) packages to printed circuit boards (PCBs). In particular, this disclosure relates to a solder ball that includes an integral spring used to ensure durable and reliable electrical and mechanical connections of IC packages to PCBs.

ICs can be assembled into protective packages which can allow expedited handling and assembly onto PCBs and which can also protect the ICs from external damage. IC packages include a large variety of different sizes, types, and physical/electrical configurations. IC package material types can include organic materials, e.g., plastics, and non-organic materials such as ceramics. Some IC package types can have standardized dimensions and tolerances, and can be registered with trade industry associations such as the Joint Electron Device Engineering Council (JEDEC). Other IC package types can use proprietary dimension and tolerance designations which can be made by only a small number of manufacturers. IC packaging can be the last assembly process before the testing and shipping of devices to customers.

A printed circuit board, or PCB, can be used to mechanically support and electrically connect electronic components using conductive paths or signal traces etched from copper sheets laminated onto non-conductive substrates. Multiple copper/insulator layer pairs, also known as "cores," can be laminated together in the fabrication of the PCB. The number and arrangement of cores can be designed to fit the needs of a variety of applications.

Vertical interconnect structures (vias) can be used to interconnect conductive signal traces between various conductive layers within the PCB. Copper shapes or areas can be used for power and ground distribution to components mounted on the PCB. The interconnect structures in the PCB can be designed to be physically and electrically compatible with the components the PCB can be used to interconnect.

SUMMARY

Embodiments can be directed towards a solder ball assembly. The solder ball assembly can include a first spring element having a first shape and formed from a first elastic electrically conductive material. The solder ball assembly can also include a second spring element having a second shape and formed from a second elastic electrically conductive material. The second spring element can be mechanically attached to the first spring element to form a spring assembly. The solder ball assembly can also include a solder ball configured to enclose the spring assembly.

Embodiments can also be directed towards an electronic packaging assembly. The electronic packaging assembly can include a set of solder ball assemblies. Each solder ball assembly can include a first spring element having a first shape and formed from a first elastic electrically conductive material. Each solder ball assembly can also include a second spring element having a second shape and formed from a second elastic electrically conductive material. The second spring element is mechanically attached to the first spring element to form a spring assembly. A solder ball can be configured to enclose the spring assembly. The electronic packaging assembly can also include an integrated circuit (IC) package having a first set attachment pads electrically and mechanically attached to the set of solder ball assemblies. The electronic packaging assembly can also include a printed circuit board (PCB) including a second set of attachment pads electrically and mechanically attached to the set of solder ball assemblies.

Embodiments can also be directed towards a method for manufacturing an electronic packaging assembly. The method can include forming attachment pads on a surface of a PCB. The method can also include aligning and positioning a mask having mask openings corresponding to locations of the attachment pads and The method can also include positioning spring assemblies within the mask openings and depositing solder paste into the openings. The method can also include performing a first reflow operation on the solder paste to enclose the spring assemblies with solder and performing, following removal of the mask, a second reflow operation on the solder paste.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

Figure 1:
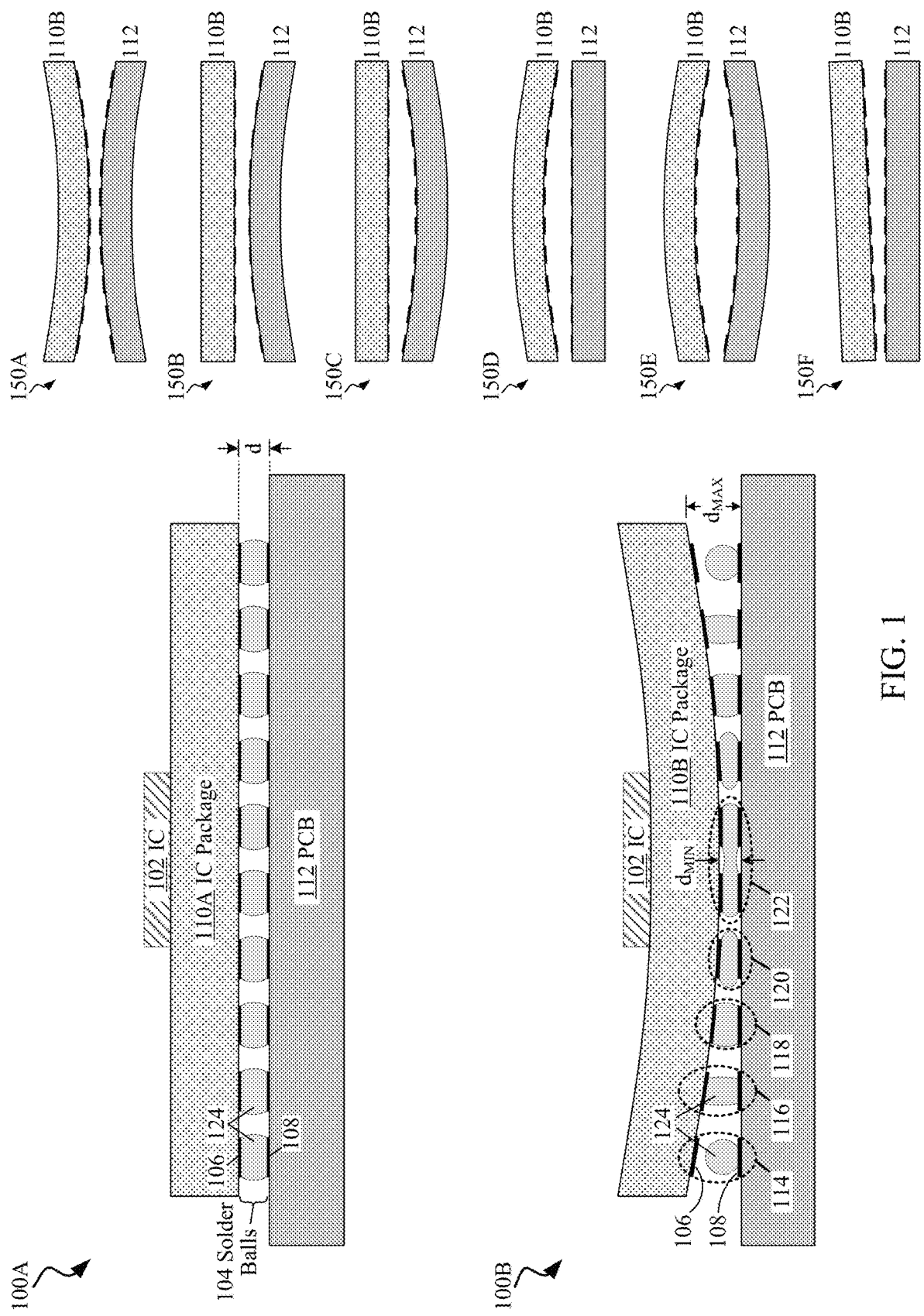
FIG. 1 includes cross-sectional views depicting attachment of, and relative warp between, integrated circuit (IC) packages and a printed circuit board (PCB), according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing ball grid array (BGA) solder balls with uniform dimensions for connecting integrated circuit (IC) electronic packages to printed circuit boards (PCBs) for electronic equipment such as servers, which can be used to provide data to clients attached to a server through a network. Such servers can include, but are not limited to web servers, application servers, mail servers, and virtual servers. While not necessarily limited thereto, embodiments discussed in this context can facilitate an understanding of various aspects of the disclosure. Certain embodiments can also be directed towards other equipment and associated applications, such as providing BGA solder balls with uniform dimensions for connecting IC electronic packages to PCBs for electronic equipment such as computing systems, which can be used in a wide variety of computational and data processing applications. Such computing systems can include, but are not limited to, supercomputers, high-performance computing (HPC) systems, and other types of special-purpose computers. Embodiments can also be directed towards providing BGA solder balls with uniform dimensions for ICs located within consumer and small office/home office (SOHO) electronic equipment such as personal computers, laptops, mobile and network server devices.

The terms "attachment pad," and "BGA pad" can be used interchangeably herein in reference to a metallic pad used to form an electrical and mechanical interconnection to an IC package or to a PCB. Such pads can include metals such as copper or copper alloys, and can be arranged in arrays that are positionally consistent with solder balls on a BGA electronic package or IC package. In the context of the present disclosure, attachment pads can be used as locations on which to place and reflow solder balls to electrically and mechanically interconnect an IC package to a PCB.

For ease of discussion, the terms "solder, "solder paste" and "solder balls" are used generally herein in reference to a conductive attachment material used to form a durable mechanical and electrical interconnection between an IC package and a PCB.

The term "component" is generally used herein to refer an IC, but can also be used in reference to a connector or socket element that makes use of the above-described connecting structures. It can be understood that the principles of the present disclosure can apply to a wide range of IC package/component types.

The terms "C-spring" and "spring," can be used interchangeably herein in reference to an elastic element located within a solder ball. The term "C-spring" and corresponding depiction is used in the present discussion in reference to a particular useful spring shape, however, it can be understood that embodiments can also include a variety of types of springs, and that the term "C-spring(s)" is not limiting.

ICs such as processors, graphics processing units (GPUs), memory chips and application-specific integrated circuits (ASICs) can be electrically and mechanically attached to a PCB through the use of reflowed solder balls. Such solder balls can be placed in a BGA arrangement, which can be particularly useful for providing a large number of high-density power and signal interconnections between an IC package and the PCB. A continuing trend of increasing numbers of IC interconnections has resulted in a reduction of solder ball diameters and placement pitches, for example, in some applications, to less than 0.5 mm. Accordingly, these reductions in solder ball diameters have decreased spacings between the IC packages and PCBs.

These relatively small spacings between IC packages and PCBs have driven a need for a high degree of planarity of both an IC package and a corresponding host PCB. Decreased solder ball size also drives precise positioning and alignment requirements for the mating, substantially planar surfaces of the IC package and PCB. These precise positioning and alignment requirements are required in order to ensure robust and reliable electrical and mechanical solder ball connections. Without precise positioning and alignment of these mating surfaces, interconnections formed by solder balls can become susceptible to defects caused by planar surface deviations such as warp. Even a slight amount of warp mismatch between IC package and PCB surfaces can result in solder ball defects that can cause catastrophic electronic system failures.

0-Both IC packages and PCBs can be formed as a laminate of multiple conductive and dielectric, layers, each having different coefficients of thermal expansion (CTEs). Thermal excursions experienced by an IC package and a corresponding PCB during both manufacturing and assembly operations can cause the IC packages and/or PCBs to exhibit thermally-induced warp. Such warp can result from asymmetrical thermally-induced expansion of the various layers of the IC package and PCB. Thermally-induced warp can be exacerbated by increases in the sizes and number of layers in an IC package and/or PCB. By way of example, the footprint dimensions of large ball-count BGA IC packages can be greater than 50 mm×50 mm.

Thermally-induced warp can result in the deviation of one or both opposing surfaces of IC packages and/or PCBs from a parallel-planar orientation. Such deviation can cause a variety of problems with electrical and mechanical characteristics of solder ball interconnections. For example, certain solder balls interconnecting an IC package and a PCB can be compressed, which can cause short-circuiting of adjacent solder balls. Certain other solder balls can be "stretched," or elongated during a solder reflow operation, which can result in mechanical failure(s) over time, for example, in response to extended thermal cycling of an IC/PCB assembly. Other solder balls may not successfully establish a connection between attachment pads of an IC and a PCB, which can result in electrical open circuits. Either open circuits or short-circuited connections can cause critical functional failures of an electronic system such as a computer or server.

Solder ball defects, as described above, can manifest themselves immediately, for example, as a short-circuit, an intermittent connection or an open circuit. Solder ball defects can also manifest themselves as latent defects, i.e., only appearing after some period of thermal cycling of the assembled IC package/component and PCB. Because certain types of solder ball defects can be masked by what initially appears to be a stable, functional electrical connection, they may not be easily detected using classical test methods. The latent failure of a single BGA connection can result in catastrophic system failure, as every signal connection can be critically important to the functioning of an electronic system.

FIG. 1 includes cross-sectional views 100A, 100B and 150A-150F that depict the attachment of, and relative warp between, IC packages, e.g., 110A, 110B and PCB 112. FIG. 1 can be particularly useful in depicting and providing an understanding of various types of warp-related solder ball interconnection defects, as introduced above. It can be understood that the views included in FIG. 1 are provided for the purpose of illustration only, and may not accurately represent dimensions, proportions, or other physical features of elements such as PCBs, IC packages, ICs and solder balls.

View 100A includes an IC 102 mounted on an IC package 110A, which is attached to PCB 112. Solder balls 104, formed from solder 124, are reflowed to attachment pads 106 of IC package 110A and to attachment pads 108 of PCB 112. In embodiments, IC 102 can be an IC such as a processor or GPU chip, IC package 110A can be a ceramic or organic multi-layer substrate, and PCB 112 can include, for example, a motherboard or daughter card. Solder balls 104 can be formed from a high-temperature solder that is reflowed using a lower-temperature solder paste to form a bond to attachment pads 106 and 108.

View 100A can be particularly useful for depicting desirable electrical and mechanical connections of IC package 110A to PCB 112 using solder balls 104. Such connections can be electrically and mechanically stable, are generally uniform in shape and size and are free of obvious physical defects, i.e., "stretched" and/or compressed solder balls, short-circuits and open circuits, as described above. The assembly depicted in view 100A can thus be understood by one of skill in the art of electrical package and/or electrical system design to be an exemplary IC package and PCB assembly. The structure of solder balls 104, as depicted, is understood to generally yield electrical and mechanical connections that are robust, durable and reliable over an extended time period. Solder balls attached to IC packages and/or PCBs have a generally spherical shape prior to reflow operation(s). Some compression or collapse may occur during reflow operation(s), as depicted in solder balls 104, view 100.

Both IC package 110A and PCB 112 include mating surfaces that are substantially planar within the normal process tolerances of semiconductor package and PCB processing facilities. An example planarity specification can be, for example, 0.004 inches (4 mils) on a device 2 inches or larger per side, however this specification can vary depending on manufacturing methods and connection type(s). View 100A depicts IC package 110A and PCB 112 separated by a distance "d." In some embodiments distance d can be, for example, 0.4 mm (15.7 mils). Distance d can vary based upon an initial, i.e., "pre-reflow" diameter of solder balls 104 and upon process operations, i.e., temperature profile, of a performed reflow operation.

View 100B, generally consistent with view 100A, includes an IC 102 mounted on IC package 110B, which is attached to PCB 112. Solder balls 104, formed from solder 124, are depicted in views 114, 116, 118, 120, 122 and reflowed to attachment pads 106 of IC package 110B and to attachment pads 108 of PCB 112. View 100B can be particularly useful for depicting examples of defective, unreliable solder ball connections of IC package 110B to PCB 112, and providing an understanding of physical/electrical differences of such connections with connections depicted and discussed in reference to view 100A. Such unreliable solder ball connections can result in a variety of both immediate and latent failure types, which can result in electronic system failures.

Views 114, 116, 118, 120 and 122 depict various types of solder ball connections and shapes that are influenced by the warp of IC package 110B with respect to PCB 112. In contrast to IC package 110A, view 100A, IC package 110B and PCB 112 are separated by a distance that varies between a minimum value of $d_{MIN}$ and a maximum value of $d_{MAX}$. Such a separation distance variation can yield, through a reflow process, a variety of solder ball sizes and configurations. Certain resulting solder ball sizes and configurations can result in defective, unreliable electrical and mechanical solder ball connections. For example, view 114 depicts a solder ball that has failed to attach to an attachment pad 106 during a reflow operation, which can result in a defective, i.e., open, connection between IC 102 and PCB 112. This open can result in a potentially catastrophic failure of IC 102, and/or an electronic system that includes the electronic assembly depicted in view 100B. The defective mechanical connection of view 114 can cause other solder balls of the assembly to bear a greater stress load, particularly during thermal excursions, which may result in crack and other types of mechanical failures.

View 116 depicts a solder ball that has attached to an attachment pad 106, but which is "stretched" or elongated. While such a connection may test as electrically functional, the reduced diameter of such a structure may make it more susceptible to long-term reliability issues, such as intermittent electrical connections caused by mechanical cracking and/or separation from attachment pads 106 and 108. View 118 depicts a solder ball having connections to both attachment pads 106 and 108 and a shape/dimensions generally consistent with solder balls 104, view 100A. The solder ball depicted in view 118 may perform according to electrical and mechanical design specifications.

View 120 depicts a solder ball that is over-compressed and flattened, relative to solder balls 104, view 100A. Such a solder ball can be at risk of causing a short-circuit with adjacent solder balls, which can result in electrical/functional failures within an electronic system. View 122 depicts two solder balls that are over-compressed and flattened, relative to solder balls 104, view 100A, and which have short-circuited together. Short-circuited solder balls can result in failures that include but are not limited to functional failures due to incorrect data signals and overcurrent conditions due to shorting of power supply connections together.

Views 150A-150F, generally consistent with view 100B, are a set of views useful for depicting various types and combinations of warp of IC package 110B and PCB 112. Such warp can result from, for example, an asymmetric cross-section stackup of IC package 110B and/or PCB 112. For ease of discussion and illustration, views 150A-150F do not include certain elements such as IC 102 and solder balls 104. However it can be understood that the warp combinations depicted by these views can result in a variable separation distance, e.g., in a range between $d_{MIN}$ and $d_{MAX}$, and resulting unreliable electrical and mechanical solder ball connections, similar to those depicted in, and discussed in reference to view 100B.

Embodiments of the present disclosure can be directed towards a solder ball that contains an integral spring, and which be used in a BGA interconnection between an IC package and a PCB. Such a solder ball can be useful in providing a force, during an assembly process, to counteract and manage the above-described effects of warp of IC packages and/or PCBs. Such solder balls containing integral springs can be particularly useful in preventing both short-circuits and open circuits resulting from unmanaged IC package and/or host PCB warp. The prevention of interconnection defects caused by IC package and/or PCB warp can result in managed and improved reliability of electrical systems such as computers, servers, network and telecom equipment.

In general, the embodiments describe an apparatus and a method for providing a solder ball assembly including an integral spring assembly, that can provide enhanced solder ball connection reliability. An electronic system according to the present disclosure can have improved reliability over a range of operating conditions including temperature.

Various aspects of the present disclosure can be useful compensating for warp in either IC package, PCB or both, by providing solder balls of uniform height. Embodiments can also be useful in compensating for non-planarity of a PCB and/or an IC package and solder ball size inconsistencies. Embodiments of the present disclosure can be useful in enforcing a particular solder ball orientation, and providing a defined solder ball shape. Such defined shape(s) can be useful, for example, in creating columnar solder balls that can be used in high-density solder ball interconnect arrays.

Embodiments of the present disclosure can also be useful in preventing solder ball outgassing and/or adjacent interconnection short-circuits. Various embodiments can be used to create cost-effective electronic interconnect structures for use with electronic systems, by using existing and proven solder ball, PCB and IC technologies.

Figure 2:
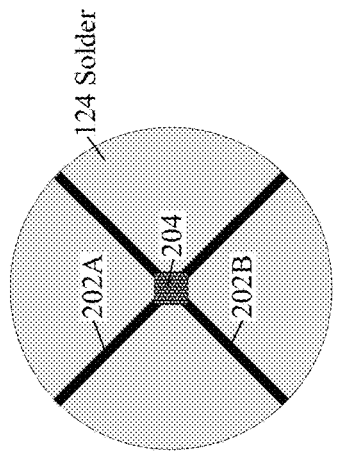
FIG. 2 includes a top view and cross-sectional views depicting solder ball assemblies, according to embodiments consistent with the figures.
Figure 2:
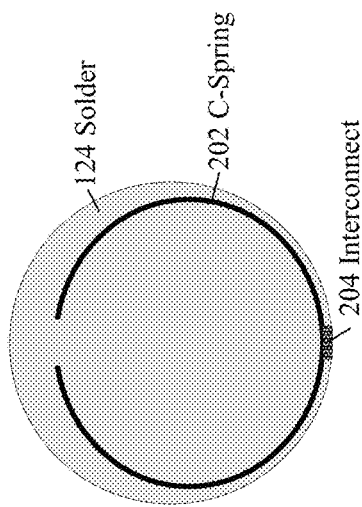
Figure 2:
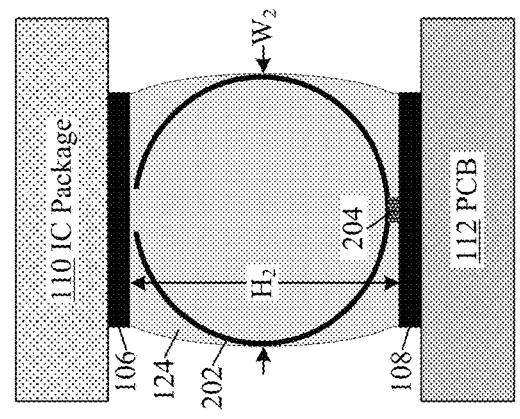
Figure 2:
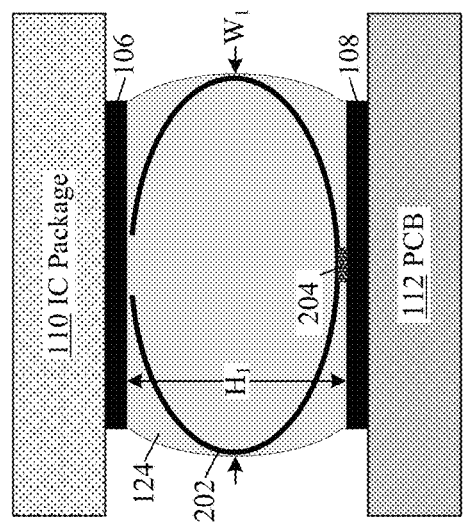

Certain embodiments relate to incorporating a spring within a solder ball used in a BGA interconnect apparatus. FIG. 2 includes a top view 225 and cross-sectional views 200, 250 and 275 depicting solder ball assemblies, according to embodiments consistent with the figures. FIG. 2 can be particularly useful for providing an understanding of the physical structure of a solder ball assembly, e.g., 200, and how the physical structure can be useful in yielding reflowed solder balls having desirable physical and mechanical properties.

Consistent cross-sectional view 200 and top view 225 each depict a solder ball assembly including a C-spring 202 enclosed by solder 124. C-spring 202 can be useful for providing a semi-rigid structure for maintaining the overall shape and dimensions of a solder ball assembly during a reflow operation. The use of C-spring 202 can help ensure that the solder balls of a IC package/PCB assembly compress to uniform height during an assembly/reflow process. C-spring 202 can also be useful in conjunction with a reflow/assembly process in which a force is exerted on a component such as an IC package, in order to cause the IC package to conform to the planarity of a corresponding PCB. The use of embodiments of the present disclosure can result in managed and enhanced structural integrity and reliability of solder ball connections within an electronic system.

In some embodiments, C-spring elements 202A and 202B can be formed from elastic, electrically conductive material(s) such as spring steel or other metals. In some embodiments, electrically non-conductive materials are contemplated. In certain embodiments, C-spring elements 202A and 202B can be formed from the same material, and in certain embodiments, C-spring elements 202A and 202B can be formed from different materials. The figures depict elements 202A and 202B as C-springs, however, in some embodiments, elements 202A and 202B can have another shape such as circular, oval, helical, or any convex polygonal shape. Solder 124 is generally a high-temperature solder, consistent with solders used to form BGA solder balls.

C-spring elements 202A and 202B are mechanically attached with an interconnect 204, which can be, for example, a weld or spot-welded joint, or a joining member configured to hold elements 202A and 202B securely together. In some embodiments, interconnect 204 can be a be or can include a weight or ferro-magnetic material fastened to the elements 202A and 202B. Such a weight or ferro-magnetic material can be useful in orienting solder ball assemblies during a positioning operation of a IC package/PCB assembly process.

Cross-sectional views 250 and 275 are consistent with views 200 and 225 and with FIG. 1, and can be useful in depicting particular embodiments of solder ball assemblies having different dimensional aspect ratios. For example, view 250 depicts a solder ball assembly having a width $W_1$ that is greater than a height $H_1$. Such a solder ball assembly can be understood to be of a size and proportions that may be "broader" and commonly or traditionally used in the assembly of IC packages to PCBs. This solder ball aspect ratio can result in stable, reliable electrical and mechanical IC/PCB interconnections.

View 275 depicts a solder ball assembly having a height $H_2$ that is greater than a width $W_2$. Such a solder ball assembly can be understood to be of a size and proportions that may be "taller," i.e., more columnar, which can be used in higher density electrical and mechanical IC/PCB interconnections. Such proportions, as enforced by the solder ball assembly 275 can be particularly useful for applications where an increased density of reliable interconnections is specified as a design requirement.

According to embodiments, the C-springs 202 within solder ball assemblies such as 250 and 275 can be used to promote or "enforce" certain specified interconnect geometries, which can provide a PCB or electronic system designer with an enhanced range of interconnect design options. In some embodiments, solder ball assemblies within a particular IC package/PCB assembly can all be of one size, and in some embodiments, such solder ball assemblies can include a number of different sizes.

Figure 3:
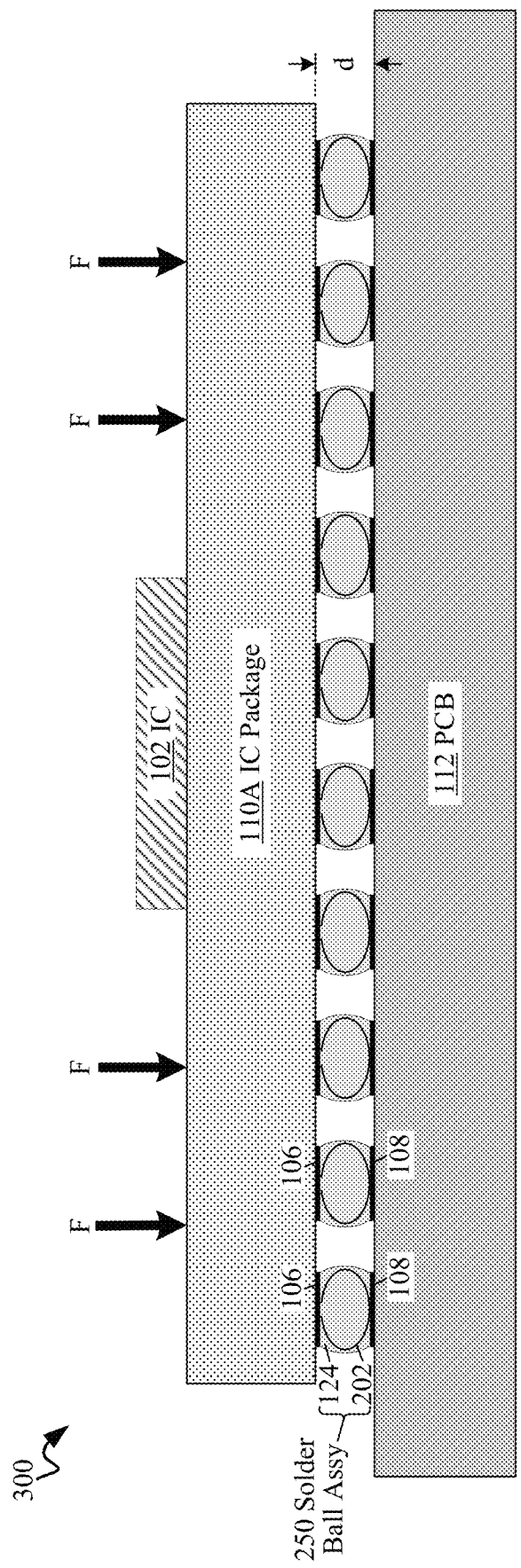
FIG. 3 depicts an electronic packaging assembly, according to embodiments consistent with the figures, particularly FIG. 2.

FIG. 3 depicts an electronic packaging assembly 300, according to embodiments consistent with the figures. According to embodiments, electronic packaging assembly 300 is consistent with the assembly depicted in view 100A, FIG. 1, while employing solder ball assemblies 250 in place of solder balls 104, FIG. 1. The use of solder ball assemblies 250 can be particularly helpful in ensuring uniform, robust electrical/mechanical connections between IC package 110A and PCB 112, particularly in scenarios when one or both of IC package 110A and PCB 112 exhibit warp characteristics, as depicted and discussed in reference to FIG. 1.

According to embodiments, C-springs 202, as depicted in, and discussed in reference to FIG. 2, can be particularly useful in maintaining a uniform spacing between mating planar surfaces of during IC package/PCB assembly and solder ball reflow operations. In embodiments, a force "F" can be applied during the assembly/reflow process in order to cause contact between the mating planar surfaces of IC package 110A and PCB and solder ball assemblies 250. The C-springs 202 can be particularly useful in managing and minimizing compression of solder ball assemblies 250 during these operations, and thus providing a managed, uniform distance "d" across the mating planar surfaces. As a result, reliability and robustness of solder ball interconnections between IC package 110A and PCB 112 can be managed and enhanced. In some embodiments, the solder ball assemblies 250 can be welded or otherwise attached to the attachment pads 108 or the attachment pads attachment pads 106 prior to the assembly/reflow operation.

Figure 4:
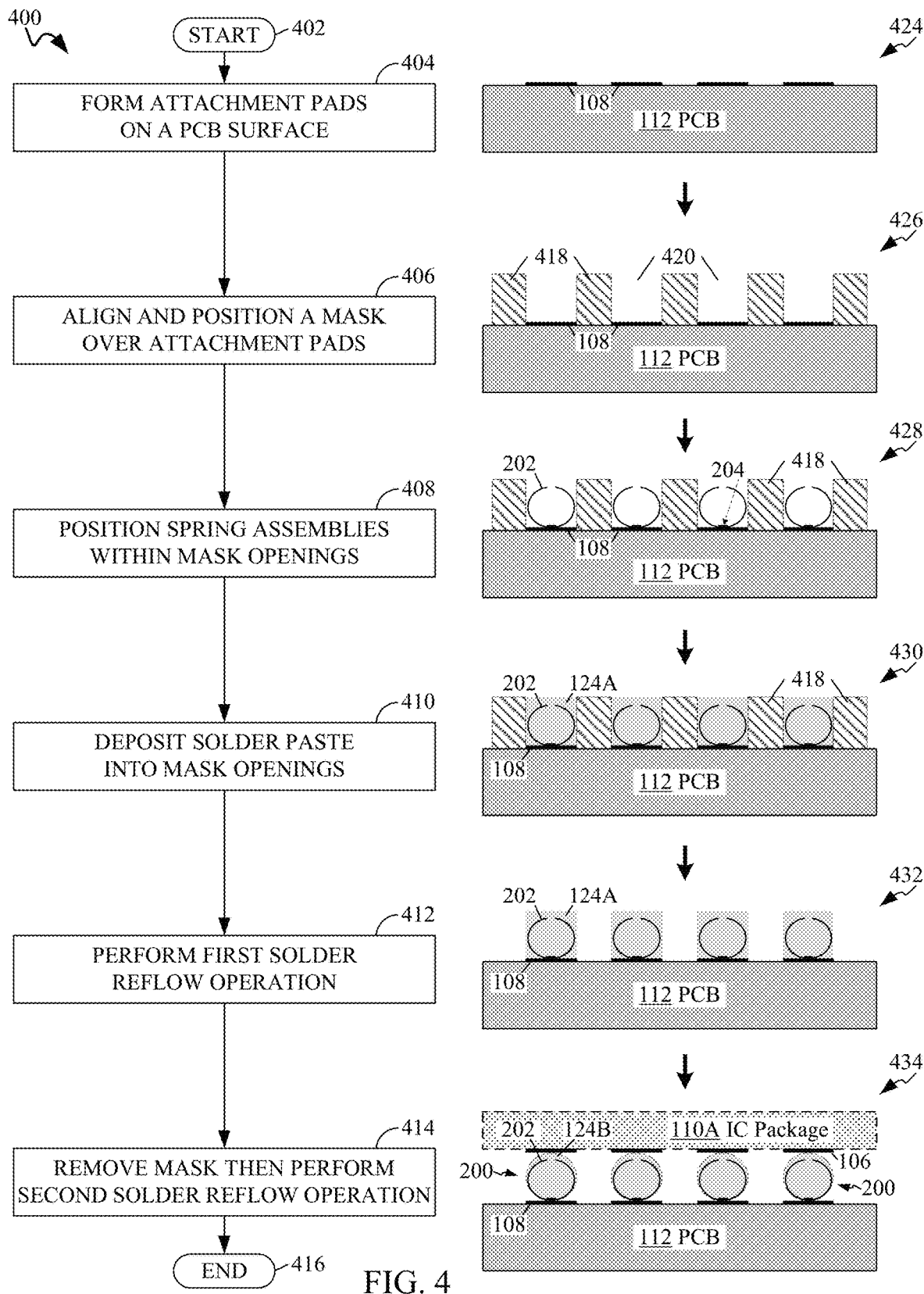
FIG. 4 depicts includes a flow diagram and corresponding process diagram views depicting a method for manufacturing an electronic packaging assembly, according to embodiments consistent with the figures.

FIG. 4 includes a flow diagram 400 and a corresponding sequential set of six cross-sectional side process diagram views 424-434 depicting a method for manufacturing an electronic packaging assembly, according to embodiments consistent with the figures. These process diagram views illustrate an example process; other views and operations can be possible. An electronic system formed by these process operations can be consistent with electronic package assembly 300, FIG. 3, and can have solder ball interconnections with enhanced reliability and durability. Each solder ball assembly is configured to electrically interconnect an IC package to a PCB, according to embodiments. Example ICs can include processors, GPUs, memory devices, ASICs, and the like. PCBs can include daughter cards motherboards, and standalone PCBs.

The execution of method 400 can result in an electronic package assembly, e.g., 300, FIG. 3, having enhanced solder ball connection reliability. An electronic assembly fabricated according to embodiments can also have improved compensation for non-planarity of a PCBs and/or an IC packages and solder ball size inconsistencies. Embodiments of the present disclosure are generally consistent with existing ICs, electronic packages, PCBs, as well as existing design methodologies and electronic system fabrication technologies and methods.

The progression depicted in views 424-434 begins with a PCB 112 having attachment pads 108 on a planar surface, view 424, and ends with a completed electronic package assembly 434. Process operations can be completed using processes and materials presently used for electronic system fabrication, such as alignment and solder processes, and solder pastes 436 and 438.

For ease of illustration, C-springs 202 and solder ball assemblies 200 are included within the views 424-434 as generic representations of springs and solder ball assemblies. It can be understood that these representations depicted herein in FIG. 4 can represent springs and/or solder ball assemblies of any size or proportion useful for particular applications.

The results of one or more process operations can be depicted in each view. For example, a view can depict the results of a C-spring 202 positioning operation and an attachment operation which can include welding the C-spring 202 to an attachment pad 108 of PCB 112. Processing operations associated with views 424-434 can include, but are not limited to formation of attachment pads 108, mask positioning and alignment, C-spring 202 positioning and attachment, solder paste deposition, solder reflow, and IC package positioning operations.

Completed structures can be generally shown in views 424-434 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

Unless explicitly directed towards another figure or view, it can be understood that textual references to figure elements contained within a discussion of an operation of method 400 generally refer to a corresponding view immediately to the right of the discussed operation box of flow diagram 400.

Method 400 moves from start 402 to operation 404. Operation 404 generally refers to forming attachment pads 108 on a surface of a PCB 112. View 424 depicts attachment pads 108 that are electrically and mechanically attached to a PCB 112. According to embodiments, attachment pads 108 can be formed on an upper surface of PCB 112 through PCB fabrication processes such as chemical etching of a layer of conductive material such as copper. The size, pitch, and arrangement of such attachment pads 108 can be specified to be compatible with current PCB solder ball technology. For example, a diameter of an attachment pads 108 can be 0.5 mm and a pad pitch can be 1.0 mm. Following the formation attachment pads 108, operation 404 can also include applying solder paste to attachment pads 108, for example, through the use of a stencil. Such solder paste can be a low-temperature paste including a fluxing agent, consistent with solder paste applied to attachment pads for IC package assembly. Once the attachment pads are formed on the surface of the PCB, the method 400 moves to operation 406.

Operation 406 generally refers to aligning and positioning a mask 418 having mask openings 420 corresponding to locations of attachment pads 108. This positioning can be done by automated or manual assembly equipment such that the mask openings 420 are aligned with attachment pads 108. According to embodiments, mask 418 can be useful in defining positions for the placement of C-springs 202. According to embodiments, these locations correspond to attachment pad locations on a mating planar surface of an IC package 110. Mask 418 can be formed from a material, e.g., a ceramic, that does not adhere to a solder paste and that is impervious to temperatures experienced during one or more solder reflow operations. Once the mask is aligning and positioned corresponding to locations of attachment pads, the method 400 moves to operation 408.

Operation 408 generally refers to positioning C-springs 202 within the mask openings 420. According to embodiments, C-springs 202 used in forming a solder ball assembly 200 can provide a defined structure for the solder ball assembly, due to adhesion of molten solder paste to the framework that a C-spring 202 provides. In some embodiments, placing the C-springs 202 within the mask openings can include vibrating the PCB 112 and mask 418 in order to settle the C-springs 202 into the mask openings. This vibration can be used in conjunction with a weight, magnet or ferro-magnetic material attached to each C-spring 202, which can assist in orienting it in a desired orientation within a mask opening 420. Following the positioning of C-springs 202 within the mask openings 420, the C-springs can be attached, e.g., by welding, to the attachment pads 108. Once the C-springs are positioned within the mask openings, the method 400 moves to operation 410.

Operation 410 generally refers to depositing solder paste 124A into the mask openings 420. In embodiments, a high-temperature solder paste can be deposited into mask openings 420 through various methods such as using a stencil with openings aligned with mask openings 420. A wiper or blade can be used to force solder through holes in the stencil into the mask openings 420. Deposited solder paste can be useful for creating a solder ball that surrounds a C-spring 202. Once the solder paste 438 is deposited into the mask openings, the method 400 moves to operation 412.

Operation 412 generally refers to performing a first reflow operation on the solder paste 124A to enclose the C-springs assemblies 202 in solder. According to embodiments, the PCB 112, mask 418, and solder paste 124A are subjected to a heating operation that reflows solder paste 124A such that it surrounds each C-spring 202. Such a heating operation can be performed in a specialized reflow oven, using a specified temperature profile, consistent with reflow operations used to attach solder balls to PCBs. Once the first reflow operation has been performed, the method 400 moves to operation 414.

Optional operation 414 generally refers to performing, following removal of the mask 418, a second reflow operation on the solder paste 124A. According to embodiments, following the cooling of the reflowed solder paste 124A of operation 412, the mask 418 is removed. In some embodiments, the second reflow operation 414 can be performed without the positioning and aligning of IC package 110A.

In some embodiments, the second reflow operation 414 can be performed following the positioning and aligning of an IC package 110A adjacent to the solder ball assemblies 200 formed in operation 412. A low-temperature solder paste can be applied to a surface of the solder ball assemblies 200 formed in operation 412, or to attachment pads 106 of an IC package 110A, prior to the second reflow operation. During the second reflow operation, the C-springs 202 can provide a mechanical force to compensate for surface non-planarity and inconsistencies in the dimensions of solder ball assemblies 200. C-springs 202 can compensate for an externally applied force applied, during the reflow operation, to ensure contact between mating surfaces of solder ball assemblies 200 on PCB 112 and IC package 110A. Once the second reflow operation is performed on the solder paste 124A, the method 400 may end at block 416.

The operations depicted in FIG. 4, as discussed above, include a sequence of operations directed towards populating attachment pads on a PCB surface with solder ball assemblies, and subsequently attaching an IC package to the assemblies. It can be appreciated that within the spirit and scope of the present disclosure, the sequence of operations can be modified to first populate the IC package attachment pads with solder ball assemblies, followed by attaching the IC package to attachment pads on the PCB surface.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A solder ball assembly comprising:
   a first spring element having a first shape and formed from a first elastic electrically conductive material;
   a second spring element having a second shape and formed from a second elastic electrically conductive material, the second spring element mechanically attached to the first spring element to form a spring assembly;
   an interconnect mechanically attaching the first spring element to the second spring element to form a spring assembly, the interconnect comprising an orienting element selected from the group consisting of a weight, a magnet, and a ferro-magnetic material; and
   a solder ball configured to enclose the spring assembly.

2. The solder ball assembly of claim 1, wherein the first spring element and the second spring element are formed from spring steel.

3. The solder ball assembly of claim 1, wherein the first elastic electrically conductive material is different from the second elastic electrically conductive material.

4. The solder ball assembly of claim 1, wherein the interconnect comprises a weight fastened to an attachment point at which the first spring element and the second spring element are mechanically attached.

5. The solder ball assembly of claim 1, wherein the solder ball includes high-temperature solder.

6. The solder ball assembly of claim 1, wherein at least one of the first spring element and the second spring element has a "C" shape.

7. The solder ball assembly of claim 1, wherein the first shape is a circle.

8. The solder ball assembly of claim 1, wherein the first shape is an oval.

9. The solder ball assembly of claim 1, wherein the second shape is a convex polygon.

10. The solder ball assembly of claim 1, wherein the second shape is a helix.

11. The solder ball assembly of claim 1, wherein the first shape is equivalent to the second shape.

12. The solder ball assembly of claim 1, wherein the first shape is different than the second shape.

13. The solder ball assembly of claim 1, wherein a height of the solder ball is greater than a width of the solder ball.

14. The solder ball assembly of claim 1, wherein a width of the solder ball is greater than a height of the solder ball.

15. An electronic packaging assembly comprising:
    a set of solder ball assemblies, each including:
       a first spring element having a first shape and formed from a first elastic electrically conductive material;
       a second spring element having a second shape and formed from a second elastic electrically conductive material;
       an interconnect mechanically attaching the first spring element to the second spring element to form a spring assembly, the interconnect comprising an orienting element selected from the group consisting of a weight, a magnet, and a ferro-magnetic material; and
       a solder ball configured to enclose the spring assembly; and
    an integrated circuit (IC) package having a first set attachment pads electrically and mechanically attached to the set of solder ball assemblies; and
    a printed circuit board (PCB) including a second set of attachment pads electrically and mechanically attached to the set of solder ball assemblies.

16. The electronic packaging assembly of claim 15, wherein the set of solder ball assemblies are welded to the set of attachment pads PCB on a surface of the PCB.

17. The electronic packaging assembly of claim 15, wherein the set of solder ball assemblies include high-temperature solder.

18. A method for manufacturing an electronic packaging assembly comprising:
    forming attachment pads on a surface of a printed circuit board (PCB);
    aligning and positioning a mask having mask openings corresponding to locations of the attachment pads;
    positioning spring assemblies within the mask openings;
    depositing solder paste into the mask openings;
    performing a first reflow operation on the solder paste to enclose the spring assemblies in solder; and
    performing, following removal of the mask, a second reflow operation on the solder paste.

19. The method of claim 18, wherein:
    the spring assemblies each include a weight fastened to an attachment point; and
    the positioning of spring assemblies within the mask openings includes vibrating the PCB to settle the spring assemblies into the mask openings.

20. The method of claim 18, wherein the second reflow operation is performed in conjunction with attaching an integrated circuit (IC) package to the spring assemblies enclosed in solder on the PCB.

* * * * *